United States Patent
Camacho et al.

(10) Patent No.: US 7,777,354 B2
(45) Date of Patent: Aug. 17, 2010

(54) INTEGRATED CIRCUIT PACKAGE SYSTEM WITH LEADED PACKAGE

(75) Inventors: Zigmund Ramirez Camacho, Singapore (SG); Jairus Legaspi Pisigan, Singapore (SG); Henry Descalzo Bathan, Singapore (SG); Lionel Chien Hui Tay, Singapore (SG)

(73) Assignee: STATS Chippac Ltd., Singapore (SG)

( * ) Notice: Subject to any disclaimer, the term of this patent is extended or adjusted under 35 U.S.C. 154(b) by 87 days.

(21) Appl. No.: 12/132,121

(22) Filed: Jun. 3, 2008

(65) Prior Publication Data

US 2008/0303122 A1  Dec. 11, 2008

Related U.S. Application Data

(60) Provisional application No. 60/942,192, filed on Jun. 5, 2007.

(51) Int. Cl.
*H01L 23/28* (2006.01)
*H01L 21/48* (2006.01)

(52) U.S. Cl. ..................... 257/787; 438/127

(58) Field of Classification Search ............... None
See application file for complete search history.

(56) References Cited

U.S. PATENT DOCUMENTS

| | | | | |
|---|---|---|---|---|
| 5,157,480 | A  * | 10/1992 | McShane et al. | 257/693 |
| 5,844,315 | A  * | 12/1998 | Melton et al. | 257/738 |
| 6,753,599 | B2 * | 6/2004 | Kim | 257/686 |
| 6,777,789 | B1 * | 8/2004 | Glenn et al. | 257/676 |
| 7,057,273 | B2 | 6/2006 | Harnden et al. | |
| 7,247,934 | B2 * | 7/2007 | Pu | 257/686 |
| 7,364,945 | B2 * | 4/2008 | Shim et al. | 438/109 |
| 7,372,141 | B2 | 5/2008 | Karnezos et al. | |
| 7,425,755 | B2 * | 9/2008 | Liu | 257/666 |
| 7,619,314 | B2 * | 11/2009 | Filoteo et al. | 257/777 |
| 2003/0038347 | A1 * | 2/2003 | Chiu et al. | 257/678 |
| 2006/0220210 | A1 | 10/2006 | Karnezos et al. | |
| 2006/0244117 | A1 | 11/2006 | Karnezos et al. | |
| 2007/0284715 | A1 * | 12/2007 | Li et al. | 257/686 |

* cited by examiner

*Primary Examiner*—Scott B Geyer
(74) *Attorney, Agent, or Firm*—Mikio Ishimaru

(57) ABSTRACT

An integrated circuit package system includes: providing a frame; attaching a leaded package having leads adjacent the frame wherein the leads extend towards a side opposite the frame; and applying a package encapsulant over the leaded package having the leads partially exposed opposite the frame.

14 Claims, 5 Drawing Sheets

INTEGRATED CIRCUIT PACKAGE SYSTEM WITH LEADED PACKAGE

CROSS-REFERENCE TO RELATED APPLICATION(S)

This application claims the benefit of U.S. Provisional Patent Application Ser. No. 60/942,192 filed Jun. 5, 2007, and the subject matter thereof is hereby incorporated herein by reference thereto.

TECHNICAL FIELD

The present invention relates generally to integrated circuit package systems and more particularly to a system for integrated circuit packages with package in package.

BACKGROUND ART

Modern electronics have become commonplace, including personal portable devices such as cellular phones, digital cameras, and music players as well as control or memory systems. These electronic products require increasing integrated circuit chip content to fit an ever-shrinking physical space as well as increasing performance.

The demands for smaller, higher performance semiconductor devices have motivated the development of new techniques for producing smaller and less expensive semiconductor devices. One of these technologies involves packaging the integrated circuit chip in as small a form factor as possible and manufacturing the integrated circuit chip as efficiently as possible.

Usually, many individual devices are constructed on the same wafer. When the devices are separated into individual rectangular units, each takes the form of an integrated circuit chip. In order to interface a chip with other circuitry, it is common to mount it with lead fingers and individually connect pad on the chip to the lead fingers using extremely fine wires. The assemblies are then packaged by individually encapsulating them in molded plastic or ceramic bodies.

Integrated circuit packaging technology has demonstrated an increase in the number of chips mounted on a single circuit board or substrate paralleling the reduction in the number of components needed for a product. The resulting packaging designs are more compact in the physical size, shape, and significantly increase overall circuit density. However, circuit density continues to be limited by the area available for mounting chips.

To condense the packaging of individual devices, packages have been developed in which more than one device can be packaged at one time for each package site. Each package site is a structure that provides mechanical support for the individual integrated circuit devices. It also provides one or more layers of interconnect lines that enable the devices to be connected electrically to surrounding circuitry.

In some cases, multi-chip devices can be fabricated faster and more cheaply than a corresponding single integrated circuit chip, that incorporates all the same functions. Some multi-chip modules have been found to increase circuit density and miniaturization, improve signal propagation speed, reduce overall device size, improve performance, and lower costs.

However, such multi-chip modules can be bulky. Package density is determined by the area required to mount a chip or module. One method for reducing the size of multi-chip modules and thereby increasing their effective density is to stack the chips vertically within the module or package. Such designs are improvements over prior packages that combined several chips and associated passive components side by side in a single, horizontal layer.

However, multi-chip modules, whether vertically or horizontally arranged, can also present problems because they usually must be assembled before the chips and chip connections can be tested. That is, because the chips and connections are so small, it is difficult to test before assembly into a package.

When chips are mounted and connected individually, the chip and connections can be tested, and a known-good-unit ("KGU") free of defects is then assembled into larger circuits. A fabrication process that uses KGU is therefore more reliable and less prone to assembly defects introduced due to bad chips. With conventional multi-chip modules, the chip cannot be individually identified as KGU before final assembly.

Despite the advantages of recent developments in semiconductor fabrication and packaging techniques, there is a continuing need for improving packaging methods, systems, and designs.

Thus, a need still remains for an integrated circuit package in package system to provide a lower profile, increase the number of devices in a package system, and reduce delamination, adhesive, and adhesion failures.

In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention includes: providing a frame; attaching a leaded package having leads adjacent the frame wherein the leads extend towards a side opposite the frame; and applying a package encapsulant over the leaded package having the leads partially exposed opposite the frame.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
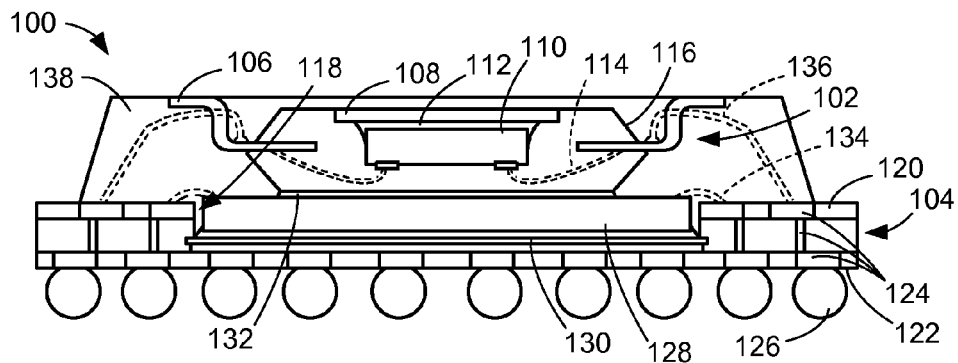
FIG. 1 is a cross-sectional view of an integrated circuit package system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing Figures.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "upward", "downward", "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
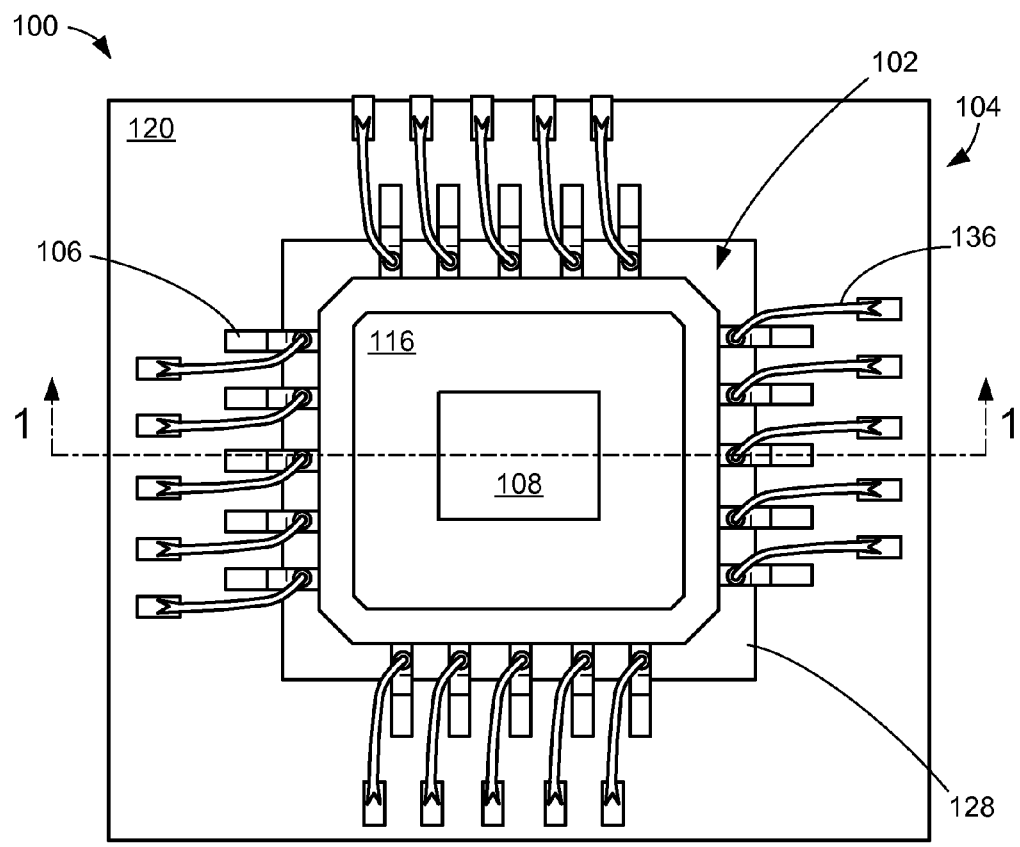
FIG. 2 is a top plan view of the integrated circuit package system.

Referring now to FIG. 1, therein is shown a cross-sectional view of an integrated circuit package system 100 taken along line 1-1 of FIG. 2 in a first embodiment of the present invention. The integrated circuit package system 100 preferably includes a leaded package 102 and a frame 104.

The leaded package 102 can be formed as a quad flat package and placed having leads 106 on a side opposite the frame 104. The frame 104 can be formed as a laminate substrate, leadframe, or any other connection structure. The leaded package 102 includes the leads 106, a die pad 108, and an integrated circuit 110. The integrated circuit 110 can be mounted over the die pad 108 with an attach layer 112 and electrically connected to the leads 106 with die connectors 114.

The leaded package 102 can also include a leaded package encapsulant 116 covering and protecting the die connectors 114, a portion of the leads 106, the integrated circuit 110, and a portion of the die pad 108. The leaded package encapsulant 116 provides the leads 106 partially exposed for connectivity to other components or a next level system. The die pad 108 can optionally be exposed for improved package performance such as connectivity, thermal transfer, or mounting.

The frame 104 can include a frame cavity 118, an upper frame layer 120, a lower frame layer 122, or frame interconnect 124. Frame connectors 126 can be formed over the frame interconnect 124 adjacent the lower frame layer 122. The frame connectors 126 shown as solder balls can be formed of any conductive material or connector technology providing electrical connectivity to a next level system such as another package or printed circuit board.

The frame cavity 118 can optionally provide an opening through the upper frame layer 120 and a recess having a portion of the frame 104 near the lower frame layer 122 as a base. The frame cavity 118 can provide spacing for a base integrated circuit 128 mounted over the frame 104 or partially within the frame cavity 118 with a base attach layer 130. The base attach layer 130 can attach the base integrated circuit 128 over the frame 104.

For example, the base integrated circuit 128 is shown mounted over the frame cavity 118 having the leaded package 102 thereover. A package attach layer 132 can attach the leaded package encapsulant 116 over the base integrated circuit 128 and adjacent the frame 104. The leads 106 can preferably extend towards a side opposite the base integrated circuit 128, the frame 104, or the package attach layer 132. The leads 106 can be partially exposed providing electrical connectivity.

Base die connectors 134 can electrically connect the base integrated circuit 128 and the frame interconnect 124 adjacent the upper frame layer 120. Similarly, leaded package connectors 136 can electrically connect the leads 106 and the frame interconnect 124 adjacent the upper frame layer 120. The leaded package connectors 136 such as j-loop wire can include an arc, bend, or kink around one of the leads 106 for forming a conductor between one and another of the leads 106.

A package encapsulant 138 can be formed over the leaded package 102, the leaded package connectors 136, the base die connectors 134, the base integrated circuit 128, and a portion of the frame 104. The package encapsulant 138 can provide a portion of the leads 106 of the leaded package 102 substantially exposed. In a manner similar to the frame connectors 126, the leads 106 can provide electrical connectivity to a next level system.

It has been unexpectedly discovered that the integrated circuit package system 100 having the leads 106 of the leaded package 102 partially exposed opposite the frame 104 improves mounting, connectivity, and design providing improved performance, manufacturability, or cost. The present invention can be re-routed into either top or bottom of packages, reduce the need for adhesives as package attach, reduce complexity including the need for costly wirebonding or signal-loss prone printed circuit board (PCB), and provide freedom with the layout and design of the frame 104.

Referring now to FIG. 2, therein is shown a top plan view of the integrated circuit package system 100. The integrated circuit package system 100 is shown without the package encapsulant 138 of FIG. 1 for clarity.

The integrated circuit package system 100 preferably includes the leaded package 102 over the base integrated circuit 128 or the frame 104. The leaded package connectors 136 can be connected to the leads 106 and the frame interconnect 124 exposed near the upper frame layer 120.

For example, the base integrated circuit 128 can be mounted over the frame 104 and partially within the frame cavity 118 of FIG. 1. The leaded package 102 can be mounted having the die pad 108 on a side opposite the upper frame layer 120. A portion of the leads 106 near a side of the leaded package 102 with the die pad 108 can extend towards a side opposite the frame 104. The leads 106 can provide connectivity on the side opposite the frame 104.

Figure 3:
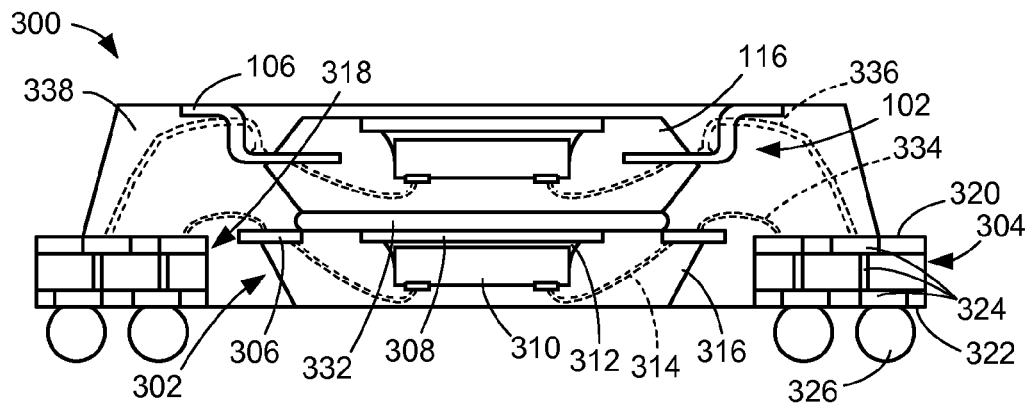
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 preferably includes the leaded package 102, a base package 302, and a frame 304.

The base package 302 can be mounted adjacent the frame 304 having base package leads 306 and a base package die pad 308 facing upward. A base package die 310 can be attached over the base package die pad 308 with a base package die attach layer 312. Base package die connectors 314 can electrically connect the base package die 310 and the base package leads 306. A base package encapsulant 316 can cover and protect the base package die 310 and the base package die connectors 314.

The leaded package 102 can be attached or mounted over the base package 302 with the leads 106 of the leaded package 102 extending towards a side opposite the frame 304. The leads 106 can provide electrical connectivity to a side opposite the frame 304 or the base package 302.

The frame 304 can be formed as a laminate substrate, leadframe, or any other connection structure. The frame 304 can include a frame cavity 318, an upper frame layer 320, or a lower frame layer 322. The frame cavity 318 can optionally provide openings through the upper frame layer 320 and the lower frame layer 322. A frame interconnect 324 can electrically connect the upper frame layer 320, the lower frame layer 322, or other components.

Frame connectors 326 can be formed over the frame interconnect 324 adjacent the lower frame layer 322. The frame connectors 326 shown as solder balls can be formed of any conductive material or connector technology providing electrical connectivity to a next level system such as another package or printed circuit board.

For example, the base package 302 is shown mounted partially within the frame cavity 318 having the base package leads 306 near the upper frame layer 320. A package attach layer 332 can attach the leaded package encapsulant 116 over the base package die pad 308 and adjacent the frame 304. The leads 106 can preferably extend towards a side opposite the base package 302, the frame 304, or the package attach layer 332. The leads 106 can be partially exposed providing electrical connectivity.

Base package connectors 334 can electrically connect the base package leads 306 of the base package 302 and the frame interconnect 324 adjacent the upper frame layer 320. Similarly, leaded package connectors 336 can electrically connect the leads 106 and the frame interconnect 324 adjacent the upper frame layer 320.

A package encapsulant 338 can be formed over the leaded package 102, the leaded package connectors 336, the base package connectors 334, the base package 302, and a portion of the frame 304. The package encapsulant 338 can provide a portion of the leads 106 of the leaded package 102 substantially exposed. In a manner similar to the frame connectors 326, the leads 106 can provide electrical connectivity to a next level system.

Figure 4:
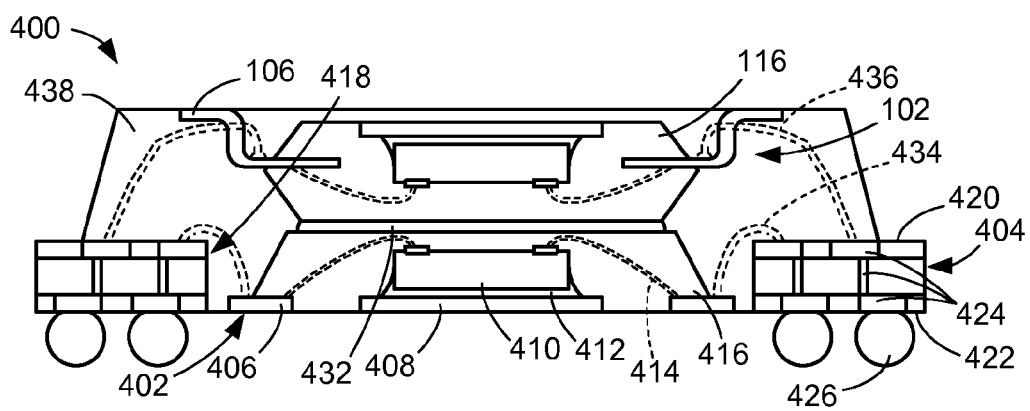
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 preferably includes the leaded package 102, a base package 402, and a frame 404.

The base package 402 can be mounted adjacent the frame 404 having base package leads 406 and a base package die pad 408 facing downward. A base package die 410 can be attached over the base package die pad 408 with a base package die attach layer 412. Base package die connectors 414 can electrically connect the base package die 410 and the base package leads 406. A base package encapsulant 416 can cover and protect the base package die 410 and the base package die connectors 414.

The leaded package 102 can be attached or mounted over the base package 402 with the leads 106 of the leaded package 102 extending towards a side opposite the frame 404. The leads 106 can provide electrical connectivity to a side opposite the frame 404 or the base package 402.

The frame 404 can be formed as a laminate substrate, leadframe, or any other connection structure. The frame 404 can include a frame cavity 418, an upper frame layer 420, or a lower frame layer 422. The frame cavity 418 can optionally provide openings through the upper frame layer 420 and the lower frame layer 422. A frame interconnect 424 can electrically connect the upper frame layer 420, the lower frame layer 422, or other components.

Frame connectors 426 can be formed over the frame interconnect 424 adjacent the lower frame layer 422. The frame connectors 426 shown as solder balls can be formed of any conductive material or connector technology providing electrical connectivity to a next level system such as another package or printed circuit board.

For example, the base package 402 is shown mounted partially within the frame cavity 418 having the base package leads 406 near the lower frame layer 422. A package attach layer 432 can attach the leaded package encapsulant 116 over the base package encapsulant 416 and adjacent the frame 404. The leads 106 can preferably extend towards a side opposite the base package 402, the frame 404, or the package attach layer 432. The leads 106 can be partially exposed providing electrical connectivity.

Base package connectors 434 can electrically connect the base package leads 406 of the base package 402 and the frame interconnect 424 adjacent the upper frame layer 420. Similarly, leaded package connectors 436 can electrically connect the leads 106 and the frame interconnect 424 adjacent the upper frame layer 420.

A package encapsulant 438 can be formed over the leaded package 102, the leaded package connectors 436, the base package connectors 434, the base package 402, and a portion of the frame 404. The package encapsulant 438 can provide a portion of the leads 106, the base package leads 406, or the base package die pad 408 substantially exposed. In a manner similar to the frame connectors 426, the leads 106 can provide electrical connectivity to a next level system.

Figure 5:
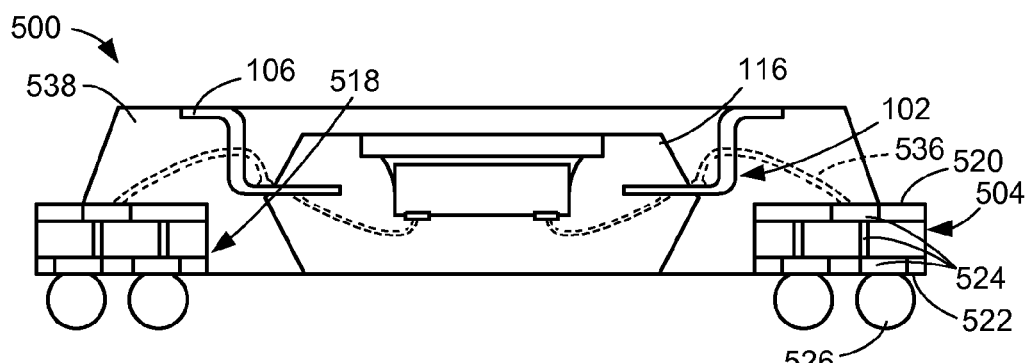
FIG. 5 is a cross-sectional view of an integrated circuit package system in a fourth embodiment of the present invention.

Referring now to FIG. 5, therein is shown a cross-sectional view of an integrated circuit package system 500 in a fourth embodiment of the present invention. The integrated circuit package system 500 preferably includes the leaded package 102 and a frame 504.

The leaded package 102 can be attached or mounted with the leads 106 of the leaded package 102 extending towards a side opposite the frame 504. The leads 106 can provide electrical connectivity to a side opposite the frame 504.

The frame 504 can be formed as a laminate substrate, leadframe, or any other connection structure. The frame 504 can include a frame cavity 518, an upper frame layer 520, or a lower frame layer 522. The frame cavity 518 can optionally provide openings through the upper frame layer 520 and the lower frame layer 522. A frame interconnect 524 can electrically connect the upper frame layer 520, the lower frame layer 522, or other components.

Frame connectors 526 can be formed over the frame interconnect 524 adjacent the lower frame layer 522. The frame connectors 526 shown as solder balls can be formed of any conductive material or connector technology providing electrical connectivity to a next level system such as another package or printed circuit board.

For example, the leaded package 102 is shown mounted partially within the frame cavity 518 having the leaded package encapsulant 116 near the lower frame layer 522. The leads 106 can preferably extend towards a side opposite the lower frame layer 522 of the frame 504. Leaded package connectors 536 can electrically connect the leads 106 and the frame interconnect 524 adjacent the upper frame layer 520. The leads 106 can be partially exposed providing electrical connectivity.

A package encapsulant 538 can be formed over the leaded package 102, the leaded package connectors 536, and a portion of the frame 504. The package encapsulant 538 can provide a portion of the leads 106 substantially exposed. In a manner similar to the frame connectors 526, the leads 106 can provide electrical connectivity to a next level system.

Figure 6:
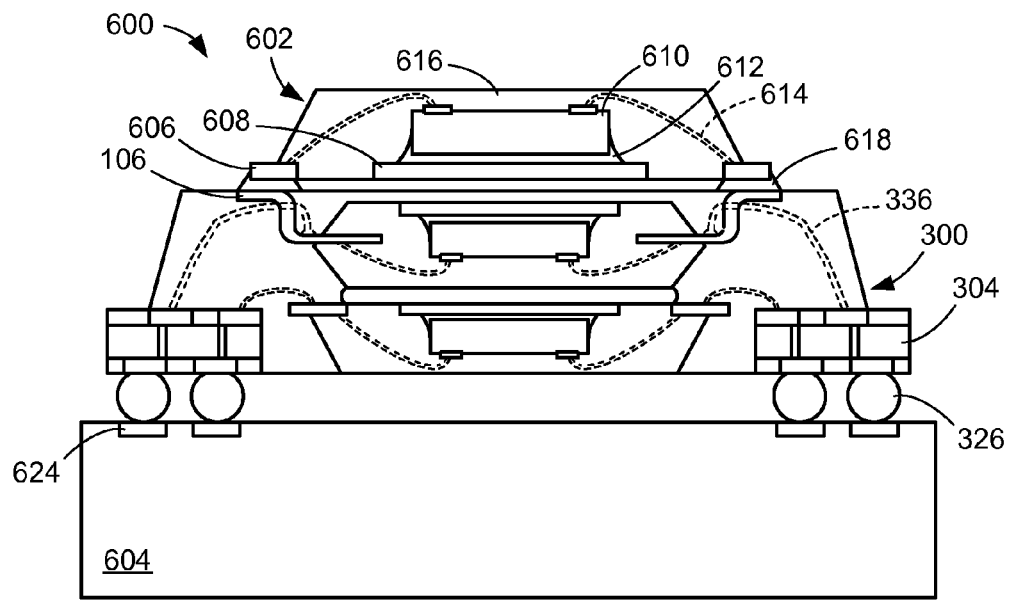
FIG. 6 is a cross-sectional view of an integrated circuit package system in a fifth embodiment of the present invention.

Referring now to FIG. 6, therein is shown a cross-sectional view of an integrated circuit package system 600 in a fifth embodiment of the present invention. The integrated circuit package system 600 preferably includes a stackable package 602, the integrated circuit package system 300, and a substrate 604.

The stackable package 602 can include stackable package leads 606 and a stackable package die pad 608. A stackable package die 610 can be attached over the stackable package die pad 608 with a stackable package die attach layer 612. Stackable package die connectors 614 can electrically connect the stackable package die 610 and the stackable package leads 606. A stackable package encapsulant 616 can cover and protect the stackable package die 610 and the stackable package die connectors 614.

A conductive layer 618 can connect the stackable package leads 606 and the leads 106 of the integrated circuit package system 300. The leads 106 can reduce or eliminate the need for adhesives, wirebonding, or a printed circuit board to attach the stackable package 602.

The substrate 604 can include substrate conductors 624. The substrate conductors 624 and the frame connectors 326 can be connected electrically or mechanically. The leads 106 and the leaded package connectors 336 can provide routing into either top or bottom of packages resulting in freedom with the layout and design of the frame 304 or the substrate 604.

Figure 7:
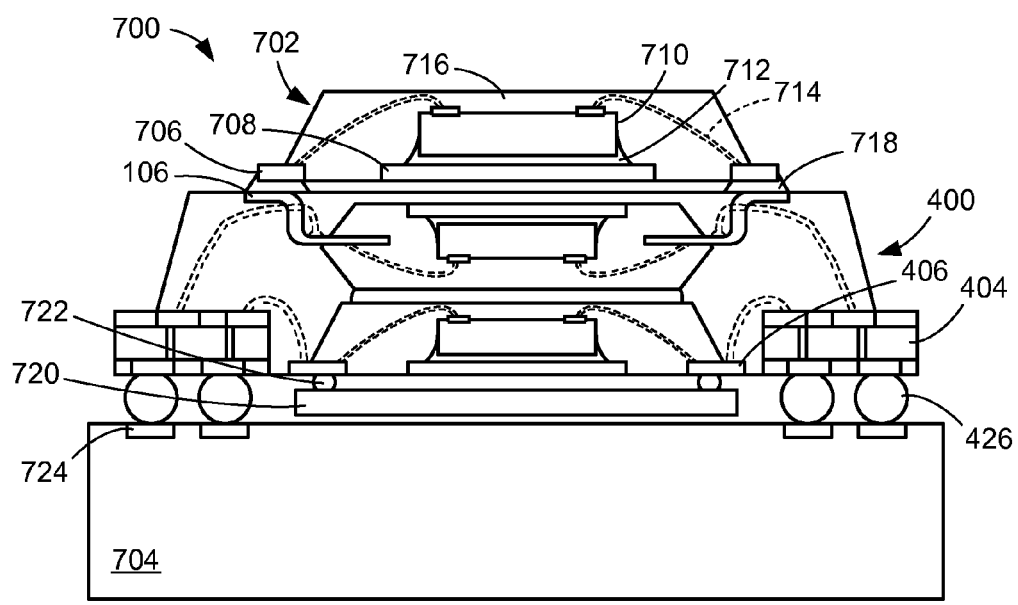
FIG. 7 is a cross-sectional view of an integrated circuit package system in a sixth embodiment of the present invention.

Referring now to FIG. 7, therein is shown a cross-sectional view of an integrated circuit package system 700 in a sixth embodiment of the present invention. The integrated circuit package system 700 preferably includes a stackable package 702, the integrated circuit package system 400, and a substrate 704.

The stackable package 702 can include stackable package leads 706 and a stackable package die pad 708. A stackable package die 710 can be attached over the stackable package die pad 708 with a stackable package die attach layer 712. Stackable package die connectors 714 can electrically connect the stackable package die 710 and the stackable package leads 706. A stackable package encapsulant 716 can cover and protect the stackable package die 710 and the stackable package die connectors 714.

A conductive layer 718 can connect the stackable package leads 706 and the leads 106 of the integrated circuit package system 400. The leads 106 can reduce or eliminate the need for adhesives, wirebonding, or a printed circuit board to attach the stackable package 702.

Optionally, a component 720 such as an integrated circuit, a package, or other device can be attached or mounted to the base package leads 406 of the integrated circuit package system 300. A component connector 722 such as solder or other conductive material can provide an electrical or mechanical connection for the component 720 and the base package leads 406.

The substrate 704 can include substrate conductors 724. The substrate conductors 724 and the frame connectors 426 can be connected electrically or mechanically. The leads 106 and the leaded package connectors 436 can provide routing into either top or bottom of packages resulting in freedom with the layout and design of the frame 404 or the substrate 704.

Figure 8:
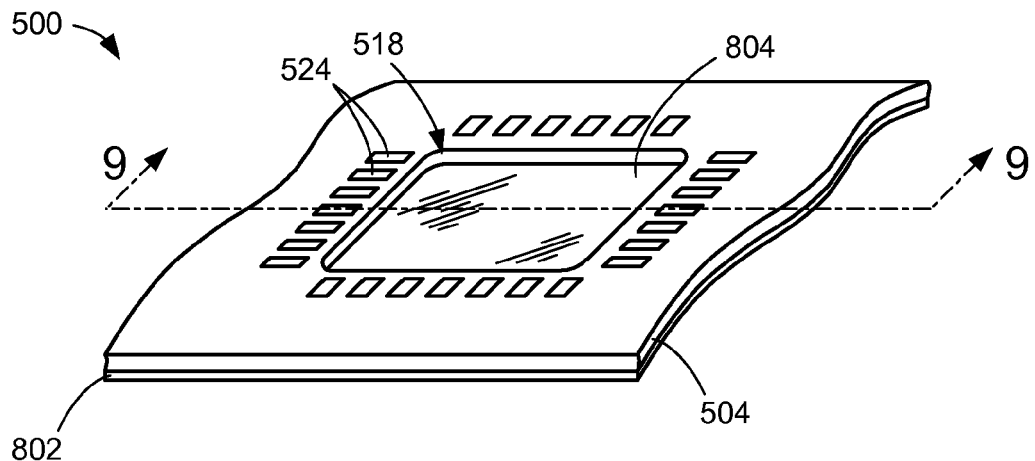
FIG. 8 is an isometric view of the integrated circuit package system in a preparation phase.

Referring now to FIG. 8, therein is shown an isometric view of the integrated circuit package system 500 in a preparation phase. The integrated circuit package system 500 preferably includes the frame 504 having the frame cavity 518, the frame interconnect 524.

A mounting layer 802 such as a coverlay tape can provide an attaching or mounting region for elements of the present invention. The mounting layer 802 can include an adhesive material over a mounting surface 804 of the mounting layer 802.

The frame 504 can be attached or mounted over the mounting surface 804 with the frame interconnect 524 substantially exposed and providing a substantially fixed location. The mounting surface 804 can also be substantially exposed adjacent the frame cavity 518.

Figure 9:
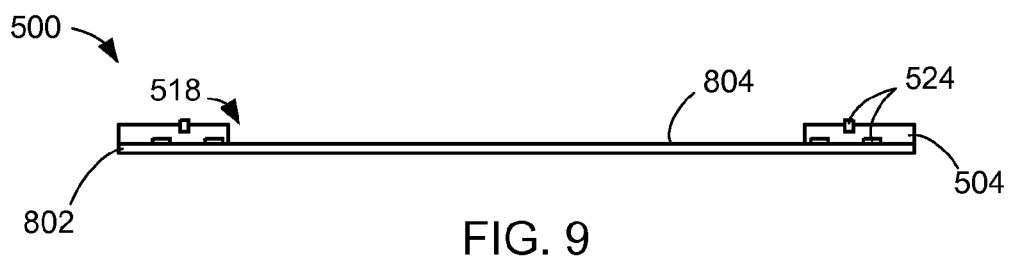
FIG. 9 is a cross-sectional view of the integrated circuit package system taken along line 9-9 of FIG. 8.

Referring now to FIG. 9, therein is shown a cross-sectional view of the integrated circuit package system 500 taken along line 9-9 of FIG. 8. Exposed portions of the mounting surface 804 can provide an attachment or mounting region within the frame cavity 518 adjacent the frame 504. Exposed portions of the frame interconnect 524 can provide electrical connectivity to the frame 504 and thereby a next level system.

Figure 10:
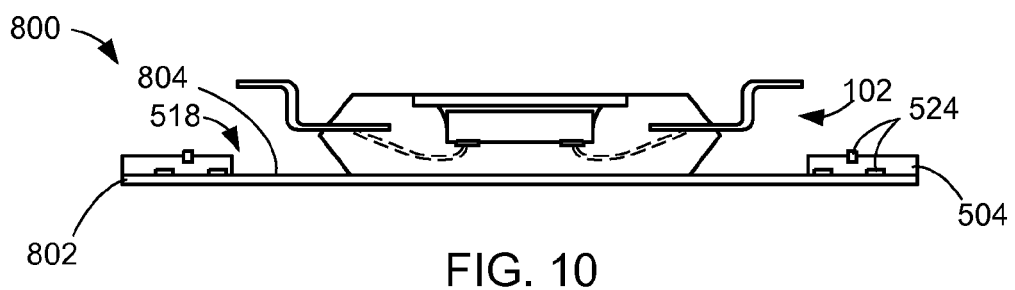
FIG. 10 is the structure of FIG. 9 in an attachment phase.

Referring now to FIG. 10, therein is shown the structure of FIG. 9 in an attachment phase. The integrated circuit package system 500 preferably includes the leaded package 102 over the mounting surface 804 partially within the frame cavity 518. The leaded package 102 can be adjacent the frame interconnect 524 of the frame 504.

The leaded package encapsulant 116 of the leaded package 102 can be attached or mounted on the mounting surface 804 providing a substantially fixed location during processing. The leads 106 of the leaded package 102 can preferably be disposed toward a side opposite the mounting layer 802.

Figure 11:
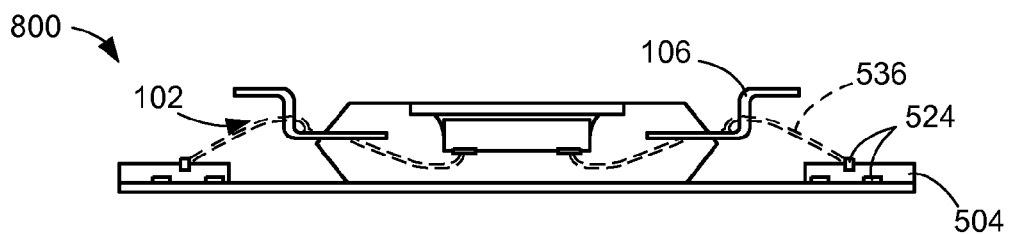
FIG. 11 is the structure of FIG. 10 in a connection phase.

Referring now to FIG. 11, therein is shown the structure of FIG. 10 in a connection phase. The integrated circuit package system 500 preferably includes the leaded package connectors 536 connecting the leads 106 of the leaded package 102 and the frame interconnect 524 of the frame 504.

The leaded package connectors 536 provide electrical connectivity for the leaded package 102 and the frame 504. The leaded package connectors 536 can formed as a j-loop having an arc, bend, or kink around one of the leads 106 and forming a conductor between one and another of the leads 106.

Figure 12:
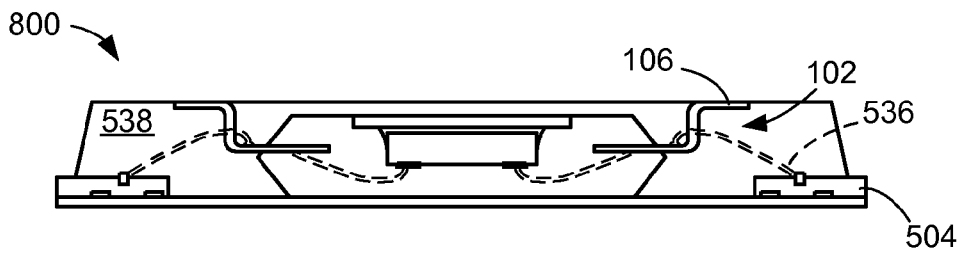
FIG. 12 is the structure of FIG. 11 in an encapsulation phase.

Referring now to FIG. 12, therein is shown the structure of FIG. 11 in an encapsulation phase. The integrated circuit package system 500 preferably includes the package encapsulant 538 over the leaded package 102, the leaded package connectors 536, and a portion of the frame 504.

The package encapsulant 538 can be applied with processes such as molding to cover and protect the leaded package connectors 536, the leaded package 102, or the frame 504. The package encapsulant 538 can provide structural integrity as well as provide the leads 106 partially exposed near a side opposite the frame 504.

Figure 13:
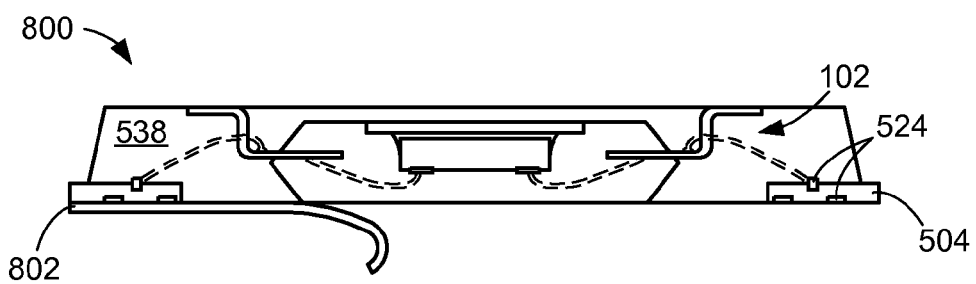
FIG. 13 is the structure of FIG. 12 in a removal phase.

Referring now to FIG. 13, therein is shown the structure of FIG. 12 in a removal phase. The package encapsulant 538 can provide structural integrity without the need for the mounting layer 802. The mounting layer 802 can provide structural integrity during processing and as well as be removed from the package encapsulant 538.

Removing the mounting layer 802 can include a process such as peeling or other removal process and provide the package encapsulant 538 or a portion of the frame 504 including the frame interconnect 524 partially exposed. Optionally, the leaded package encapsulant 116 can also be partially exposed.

Figure 14:
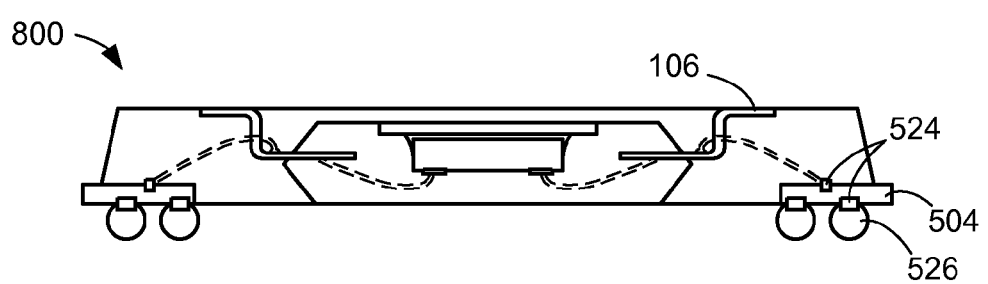
FIG. 14 is the structure of FIG. 13 in a singulation phase.

Referring now to FIG. 14, therein is shown the structure of FIG. 13 in a singulation phase. The integrated circuit package system 500 preferably includes the frame connectors 526 over the frame 504 on a side opposite the leads 106.

The frame connectors 526 can provide electrical connectivity for the frame 504 and a next level system such as another package or a next level system. Connecting the frame connectors 526 can thereby provide connectivity to the devices included in the present invention.

Figure 15:
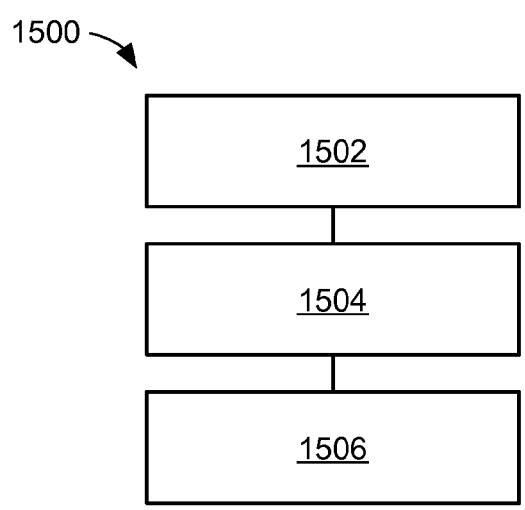
FIG. 15 is a flow chart of an integrated circuit package system for manufacturing the integrated circuit package system in an embodiment of the present invention.

Referring now to FIG. 15, therein is shown a flow chart of an integrated circuit package system 1500 for manufacturing the integrated circuit package system 100 in an embodiment of the present invention. The system 1500 includes providing a frame in a block 1502; attaching a leaded package having leads adjacent the frame wherein the leads extend towards a side opposite the frame in a block 1504; and applying a package encapsulant over the leaded package having the leads partially exposed opposite the frame in a block 1506.

In greater detail, a system to provide the method and apparatus of the integrated circuit package system 100, in an embodiment of the present invention, is performed as follows:

1. Providing a frame having an upper frame layer and a lower frame layer.
2. Attaching a leaded package having leads over the upper frame layer wherein the leads extend towards a side opposite the lower frame layer frame.
3. Applying a package encapsulant over the leaded package having the leads partially exposed opposite the lower frame layer.
4. Attaching frame connectors over the lower frame layer.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a frame having an upper frame layer and a lower frame layer;
   attaching a leaded package having leads over the upper frame layer wherein the leads extend towards a side opposite the lower frame layer;
   applying a package encapsulant over the leaded package having the leads partially exposed opposite the lower frame layer; and
   attaching frame connectors over the lower frame layer.

2. The method as claimed in claim 1 wherein providing the frame includes forming a frame cavity providing an opening in the upper frame layer or the lower frame layer.

3. The method as claimed in claim 1 wherein attaching the leaded package includes attaching leaded package connectors in a shape of a j-loop to the leads and the frame.

4. The method as claimed in claim 1 further comprising:
   attaching a base package having a base package lead and a base package die pad adjacent the frame, the base package lead and the base package die pad facing upward;
   attaching the leaded package over the base package and adjacent the frame; and
   attaching a stackable package over the leads of the leaded package.

5. The method as claimed in claim 1 further comprising:
   attaching a base package having a base package lead and a base package die pad adjacent the frame, the base package lead and the base package die pad facing downward;
   attaching the leaded package over the base package and adjacent the frame; and
   attaching a stackable package over the leads of the leaded package.

6. An integrated circuit package system comprising:
   a frame having an upper frame layer and a lower frame layer;
   a leaded package having leads over the upper frame layer wherein the leads extend towards a side opposite the lower frame layer; and
   a package encapsulant over the leaded package having the leads partially exposed opposite the lower frame layer; and
   frame connectors over the lower frame layer.

7. The system as claimed in claim 6 wherein the frame includes a frame cavity.

8. The system as claimed in claim 6 further comprising leaded package connectors attached to the leads and the frame.

9. The system as claimed in claim 6 further comprising a base package having a base package lead and a base package die pad adjacent the frame, the base package lead and the base package die pad facing upward with the leaded package thereover and adjacent the frame.

10. The system as claimed in claim 6 further comprising a base package having a base package lead and a base package die pad adjacent the frame, the base package lead and the base package die pad facing downward with the leaded package thereover and adjacent the frame.

11. The system as claimed in claim 6 wherein the frame includes a frame cavity providing an opening in the upper frame layer or the lower frame layer.

12. The system as claimed in claim 6 further comprising leaded package connectors in a shape of a j-loop to the leads and the frame.

13. The system as claimed in claim 6 further comprising:
a base package having a base package lead and a base package die pad adjacent the frame, the base package lead and the base package die pad facing upward with the leaded package thereover and adjacent the frame; and
a stackable package over the leads of the leaded package.

14. The system as claimed in claim 6 further comprising:
a base package having a base package lead and a base package die pad adjacent the frame, the base package lead and the base package die pad facing downward with the leaded package thereover and adjacent the frame; and
a stackable package over the leads of the leaded package.

* * * * *